(12) United States Patent
Kim

(10) Patent No.: US 7,795,946 B2
(45) Date of Patent: Sep. 14, 2010

(54) LEVEL SHIFTER CAPABLE OF IMPROVING CURRENT DRIVABILITY

(75) Inventor: Saeng Hwan Kim, Suwon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/315,010

(22) Filed: Nov. 26, 2008

(65) Prior Publication Data
US 2009/0302924 A1    Dec. 10, 2009

(30) Foreign Application Priority Data
Jun. 4, 2008    (KR)  ............ 10-2008-0052692

(51) Int. Cl.
*H03L 5/00*    (2006.01)
(52) U.S. Cl. ............... 327/333; 326/63; 326/81
(58) Field of Classification Search ......... 326/62–63, 326/80–81; 327/306, 333
See application file for complete search history.

(56) References Cited
U.S. PATENT DOCUMENTS

| | | | |
|---|---|---|---|
| 4,029,973 A * | 6/1977 | Kobayashi et al. | 326/88 |
| 6,147,923 A | 11/2000 | Nakano | |
| 6,677,798 B2 * | 1/2004 | Chang et al. | 327/333 |
| 6,700,429 B2 * | 3/2004 | Kanno et al. | 327/333 |
| 7,282,956 B2 * | 10/2007 | Lee | 326/88 |
| 7,368,970 B2 | 5/2008 | Lin et al. | |
| 7,436,213 B2 | 10/2008 | Nojiri | |
| 2008/0048754 A1 * | 2/2008 | Woo et al. | 327/333 |

FOREIGN PATENT DOCUMENTS

| | | |
|---|---|---|
| KR | 10-0347356 | 7/2002 |
| KR | 1020020084570 A | 11/2002 |
| KR | 1020030011065 A | 2/2003 |

* cited by examiner

*Primary Examiner*—Dinh T. Le
(74) *Attorney, Agent, or Firm*—John P. White; Cooper & Dunham LLP

(57) ABSTRACT

A level shifter circuit is provided that is capable of improving current drivability and executing stable operation with a low voltage by boosting a voltage level of an input signal. The level shifter circuit includes a level shifting unit for producing a boosted voltage by boosting an input signal and shifting a voltage level of the boosted voltage to output an output signal.

6 Claims, 2 Drawing Sheets

LEVEL SHIFTER CAPABLE OF IMPROVING CURRENT DRIVABILITY

TECHNICAL FIELD

The present disclosure relates to a semiconductor device and, more particularly, to a level shifter in a semiconductor device.

BACKGROUND

Generally, a word line driver of a semiconductor memory device uses a high voltage VPP which is higher than a power supply voltage VDD, and a driving signal, which drives the word line driver, swings between the power supply voltage VDD and a ground voltage VSS, while the word line driver needs a swing voltage level between the high voltage VPP and the power supply voltage VDD. In the case where these two circuits (that is, power supply and word line driver) are directly coupled to each other without a level conversion circuit, leakage current can be caused in the circuit that uses the high voltage VPP. Therefore, a level shifter must be disposed between these two circuits.

FIG. 1 is a circuit diagram illustrating a conventional level shifter. In FIG. 1, the reference numerals VDDL and VDDH denote a low voltage level and a high voltage level, respectively. In the conventional semiconductor memory device, the low voltage level VDDL may be a low voltage VDD and the high voltage level VDDH may be a power supply voltage VDD.

In FIG. 1, a signal INb swings between the low voltage VDDL and the ground voltage VSS and a level shifter circuit is added in order to change the signal INb into a signal which swings between the high voltage VDDH and the ground voltage VSS.

A problem of the conventional level shifter will be explained shortly. First, when the input signal INb of the level shifter transits from a low level to a high level, a NMOS transistor mn1 is turned on and a NMOS transistor mn2 is turned off. A voltage level on a node AA drops to the ground voltage VSS through the NMOS transistor mn1 which is turned on. At this time, a PMOS transistor mp2 is turned on so that a node BB transits to a high voltage level and a conflict occurs between a PMOS transistor mp1 and the NMOS transistor mn1 before the PMOS transistor mp1 is turned off. Further, when the input signal INb transmits from a high voltage level to a low voltage level, a conflict occurs between the PMOS transistor mp2 and the NMOS transistor mn2.

When the drivability of the PMOS transistor is lower than that of the NMOS transistor, a normal operation is not guaranteed. Accordingly, the current drivability of the NMOS transistors is to be reinforced by increasing the size of the NMOS transistors in order to make the level shifter stable and fast. However, there is a limitation of the reinforcement of the drivability of the NMOS transistors with such a size increment as the input signal INb becomes lower and lower up to the threshold voltage of the NMOS transistors mn1 and mn2.

As mentioned above, the conventional level shifter circuit has a limitation of the current drivability which can be reinforced by increasing the size of the NMOS transistors when the input signal INb has a low voltage level.

SUMMARY

In an aspect of the present disclosure, a level shifter circuit is provided that is capable of improving current drivability and executing stable operation with a low voltage by boosting a voltage level of an input signal.

In an embodiment, a level shifter circuit includes a level shifting unit configured to generate a boosted voltage by boosting an input signal and shift a voltage level of the boosted voltage to output an output signal.

The level shifting unit includes a voltage boosting unit configured to boost a voltage level of the input signal and output the boosted voltage, and a voltage level shifter configured to shift the voltage level of the boosted voltage to output the output signal.

The voltage boosting unit includes a voltage level setup unit configured to receive the input signal and set up voltage levels on first and second nodes in response to a power supply voltage signal, a delay unit configured to delay the input signal, and a pumping unit configured to boost the voltage levels on the first and second nodes and output the boosted voltage, in response to an output signal of the delay unit.

The voltage level setup unit includes a first NMOS transistor configured to set up the voltage level on the first node in response to the power supply voltage signal, and a second NMOS transistor configured to set up the voltage level on the second node in response to the power supply voltage signal.

The delay unit includes a plurality of inverters to delay and output the input signal.

The pumping unit includes first and second capacitors to pump up the voltage levels on the first and second nodes in response to the output signal of the delay unit.

The first and second nodes are respective input nodes of the voltage level shifter.

In another embodiment, a level shifter circuit includes a voltage level setup unit configured to receive an input signal, and set up voltage levels on first and second nodes in response to a power supply voltage signal, a delay unit configured to delay the input signal, a pumping unit configured to output the boosted voltage by boosting the voltage levels on the first and second nodes in response to an output signal of the delay unit, a pull-down driving unit configured to perform a pull-down operation in response to voltage levels on the first and second nodes, and a pull-up driving unit configured to perform a pull-up operation in response to an output voltage of pull-down driving unit.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF PREFERRED EMBODIMENTS

Hereinafter, embodiments of the present disclosure will be described with reference to accompanying drawings. However, the embodiments are for illustrative purposes only and are not intended to limit the scope of the invention and the claims appended hereto.

Figure 1:
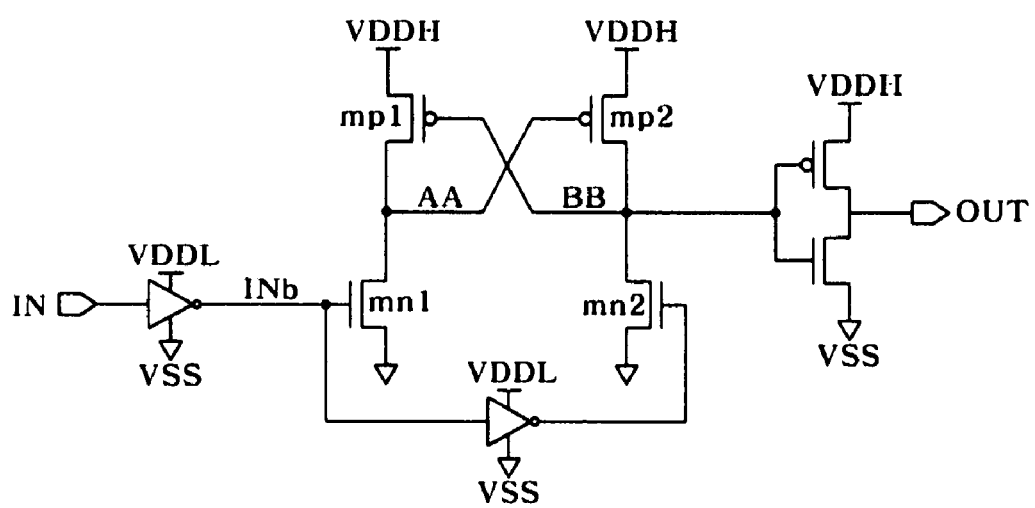
FIG. 1 is a circuit diagram illustrating a conventional level shifter.
Figure 2:
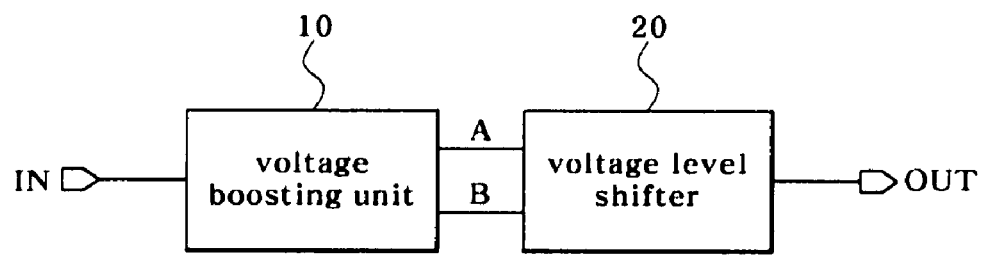
FIG. 2 is a block diagram illustrating an example of a level shifter according to an exemplary embodiment of the present disclosure.

FIG. 2 is a block diagram illustrating an example of a level shifter according to an exemplary embodiment of the present disclosure.

Referring to FIG. 2, the level shifter includes a voltage boosting unit 10 to increase a voltage level of an input signal IN and output a boosted voltage, and a voltage level shifting unit 20 to shift a voltage level of the boosted voltage.

Figure 3:
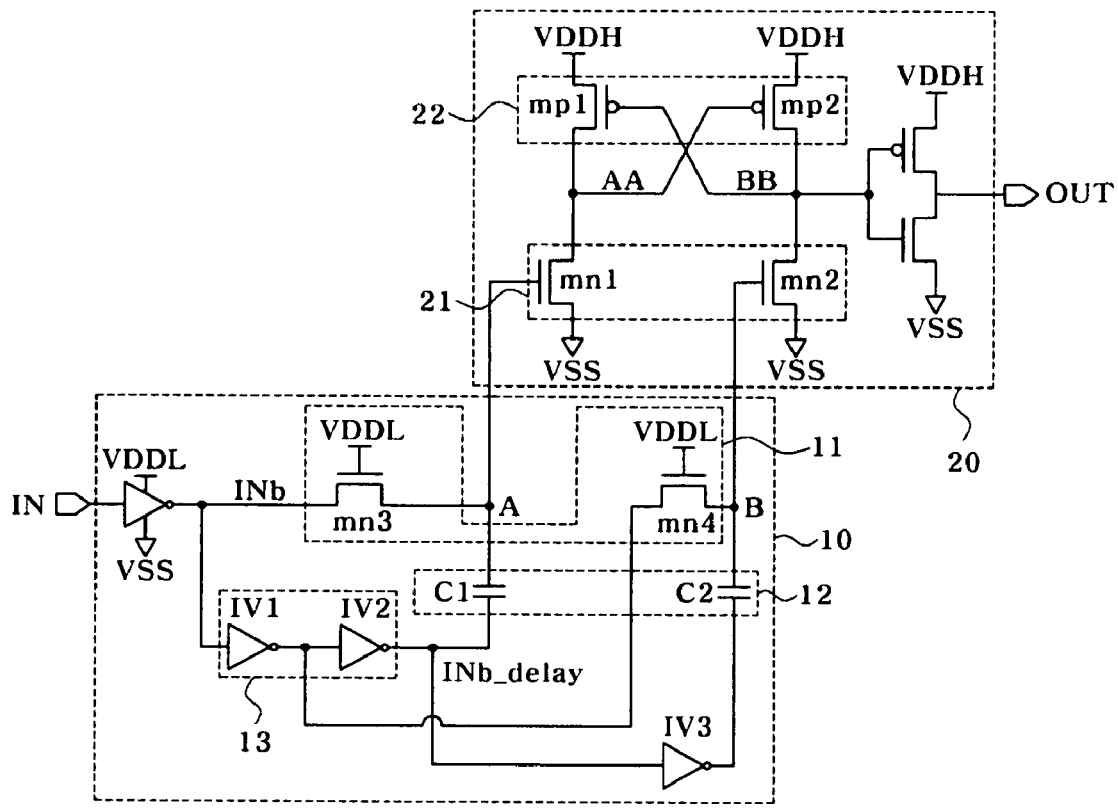
FIG. 3 is a circuit diagram illustrating an example of a configuration of the level shifter of FIG. 2.

FIG. 3 is a circuit diagram illustrating an example of configuration of the level shifter of FIG. 2.

Referring to FIG. 3, the voltage boosting unit 10 includes a voltage level setup unit 11 configured to receive an external signal IN and set up voltage levels on first and second nodes A and B in response to a power supply voltage VDDL, a delay unit 13 to delay an input signal INb which is generated by the external signal IN, and a pumping unit 12 to boost the voltage levels on the first and second nodes A and B and output boosted voltages, in response to an output signal of the delay unit 13.

The voltage level setup unit 11 includes a first NMOS transistor mn3 to set up the voltage level on the first node A in response to the power supply voltage VDDL, and a second NMOS transistor mn4 to set up the voltage level on the second node B in response to the power supply voltage VDDL. These first and second NMOS transistor mn3 and mn4 set up the voltage levels on the first and second nodes A and B to a voltage level of VDDL-Vt.

The delay unit 13 includes a plurality of inverters IV1 and IV2 to output a delayed signal by delaying the input signal INb.

The pumping unit 12 includes first and second capacitors C1 and C2 to pump up the voltage levels on the first and second nodes A and B in response to a delay signal INb_delay of the delay unit 13. The first and second capacitors C1 and C2 increase the voltage levels on the first and second nodes A and B up to the voltage level of the power supply voltage VDDL, by means of a coupling effect.

The voltage level shifting unit 20 includes a pull-down driving unit 21 for performing a pull-down operation in response to the voltage levels on the first and second nodes A and B and a pull-up driving unit 22 for performing a pull-up operation in response to output voltages of the pull-down driving unit 21.

The pull-down driving unit 21 includes a first pull-down transistor mn1 for performing a pull-down operation of a third node AA in response to the voltage level on the first node A and a second pull-down transistor mn2 for performing a pull-down operation of a fourth node BB in response to the voltage level on the second node B.

The pull-up driving unit 22 includes a first pull-up transistor mp2 for performing a pull-up operation of the fourth node BB in response to the voltage level on the third node AA and a second pull-up transistor mp1 for performing a pull-up operation of the third node AA in response to the voltage level on the fourth node BB.

Figure 4:
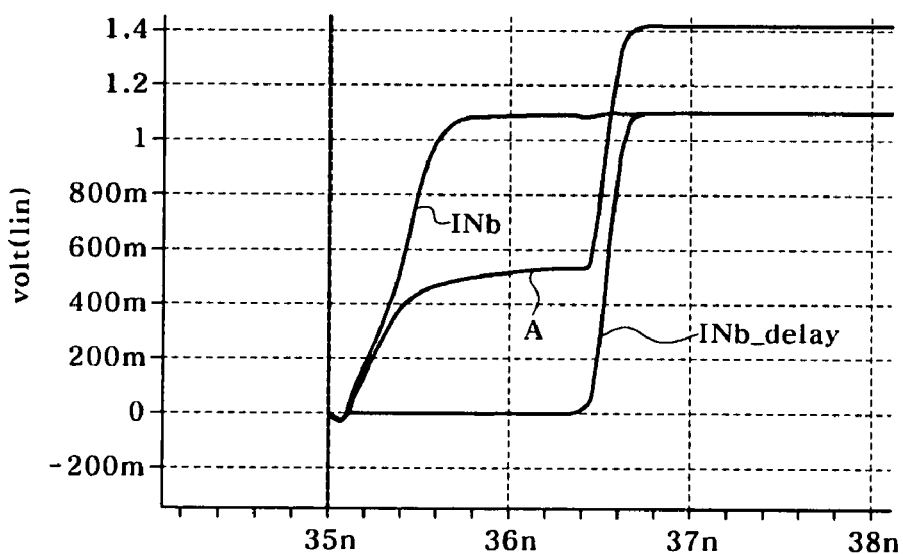
FIG. 4 is a graph showing results of simulation of the level shifter of FIG. 2.

FIG. 4 is a graph showing results of simulation of the level shifter of FIG. 2. The boosting operation, in which the voltage level on the first node A is higher than the voltage level of the input signal INb, is shown in FIG. 4 (this boosting operation on the first node A is the same as that on the second node B). The voltage levels of the input signal INb, the first node A, and the delay signal INb_delay of the input signal INb are shown in the simulation of FIG. 4.

For example, when the input signal INb transits from a low level to a high level, the voltage level of the first node A is set up to the voltage level of VDDL-Vt through the first NMOS transistor mn3 of the voltage level setup unit 11.

Subsequently, when the delay signal INb_delay from the delay unit 13 transits from a low level to a high level, the voltage level of the first node A is increased due to the coupling effect of the first capacitor C1.

Finally, the voltage level of the first node A is increased up to the voltage level of 2*VDDL-Vt. Actually, as shown in FIG. 4, the voltage level of the first node A is slightly lower than the voltage level of 2*VDDL-Vt because the capacitance of the transistor and the parasite capacitance. If the voltage level of the first node A is increased up to the voltage level of 2*VDDL-Vt, the voltage level of the first node A is saturated at the voltage level of 2*VDDL-Vt because the first NMOS transistor mn3 is turned off.

The voltage level of the first node A which is boosted higher than the input signal INb turns on the first pull-down transistor mn1 of voltage level shifting unit 20 while the second pull-down transistor mn2 is turned off by an inverted signal which is produced by inverting the delay signal INb_delay of the delay unit 13 through an inverter IV3.

The first pull-down transistor mn1, which is turned on, drops the voltage level of the third node AA to a ground voltage level VSS. The first pull-up transistor mp2 is turned on so that the voltage level of the fourth node BB is increased up to the voltage level of VDDH.

Next, the second pull-up transistor mp1 is turned off in response to the voltage level of VDDH of the fourth node BB.

Accordingly, the boosted voltage of the first node A increases the drivability of the first pull-down transistor mn1 so that the conflict which is caused by the second pull-up transistor mp1 is prevented.

On the other hand, when the input signal INb transits from a high level to a low level, the voltage level of the second node B is set up to the voltage level of VDDL-Vt through the second NMOS transistor mn4 of the voltage level setup unit 11.

Subsequently, when the delay signal INb_delay from the delay unit 13 transits from a high level to a low level, the voltage level of the second node B is increased by means of the coupling effect of the second capacitor C1.

Finally, the voltage level of the second node B is increased up to the voltage level of 2*VDDL-Vt. If the voltage level of the second node B is increased up to the voltage level of 2*VDDL-Vt, the voltage level of the second node B is saturated at the voltage level of 2*VDDL-Vt because the second NMOS transistor mn4 is turned off.

The voltage level of the second node B which is boosted higher than the input signal INb turns on the second pull-down transistor mn2 of the voltage level shifting unit 20 while the first pull-down transistor mn1 is turned off by the low level signal on the first node A.

The second pull-down transistor mn2, which is turned on, drops the voltage level of the fourth node BB to the ground voltage level VSS. The second pull-up transistor mp1 is turned on so that the voltage level of the third node AA is increased up to the voltage level of VDDH.

Next, the first pull-up transistor mp2 is turned off in response to the voltage level of VDDH of the third node AA.

Accordingly, the boosted voltage of the second node B increases the drivability of the second pull-down transistor mn2 so that the conflict which is caused by the first pull-up transistor mp2 is prevented.

As apparent from the above, the level shifter stably operates with the improvement of the current drivability, by using the boosted voltage of the input signal.

Although examples and exemplary embodiments of the present invention have been described for illustrative purposes, those skilled in the art will appreciate that various modifications, additions and substitutions are possible, without departing from the scope and spirit of the disclosure and the accompanying claims.

The present disclosure claims priority to Korean application 10-2008-0052692, filed on Jun. 4, 2008, the entire contents of which are incorporated herein by reference.

What is claimed is:

1. A level shifter circuit comprising:
a first buffer configured to buffer an input signal;
a first transfer unit configured to transfer an output signal from the first buffer to a first node;
a second buffer configured to buffer an output signal from the first buffer;
a second transfer unit configured to transfer an output signal from the second buffer to a second node;
a third buffer configured to buffer an output signal from the second buffer;
a pumping unit configured to couple the output of the second buffer to the first node and the output of the third buffer to the second node and configured to pump up voltages of the first node and the second node; and
a voltage level shifting unit configured to shift levels of the first node and the second node and output a shifter voltage level.

2. The level shifter of claim 1, wherein the first transfer unit includes a first NMOS transistor for setting up the voltage level on the first node in response to the input signal, and the second transfer unit comprises a second NMOS transistor for setting up the voltage level on the second node in response to the input signal.

3. The level shifter of claim 1, wherein the first buffer comprises a delay unit that includes a plurality of inverters to delay the input signal and output a delayed signal.

4. The level shifter of claim 1, wherein the pumping unit includes first and second capacitors to pump up the voltage levels on the first and second nodes in response to the output signal of the second buffer.

5. The level shifter of claim 1, further comprising a pull-down driving unit that includes:
a first pull-down transistor for performing a pull-down operation in response to the voltage level of the first node; and
a second pull-down transistor for performing a pull-down operation in response to the voltage level of the second node.

6. The level shifter of claim 5, further comprising a pull-up driving unit that includes:
a first pull-up transistor for performing a pull-up operation in response to an output signal of the first pull-down transistor; and
a second pull-up transistor for performing a pull-up operation in response to an output signal of the second pull-down transistor.

* * * * *